United States Patent
Matsuo

(10) Patent No.: US 8,138,552 B2
(45) Date of Patent: Mar. 20, 2012

(54) SEMICONDUCTOR DEVICE AND METHOD OF MANUFACTURING THE SAME

(75) Inventor: Kouji Matsuo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 579 days.

(21) Appl. No.: 12/338,641

(22) Filed: Dec. 18, 2008

(65) Prior Publication Data

US 2009/0189203 A1    Jul. 30, 2009

(30) Foreign Application Priority Data

Dec. 20, 2007  (JP) .................................. 2007-328907

(51) Int. Cl.
*H01L 21/70* (2006.01)

(52) U.S. Cl. ........ 257/369; 257/288; 257/327; 257/368; 257/408

(58) Field of Classification Search .................. 257/288, 257/327, 368–369, 408
See application file for complete search history.

(56) References Cited

U.S. PATENT DOCUMENTS

| | | | |
|---|---|---|---|
| 6,159,815 A * | 12/2000 | Lustig et al. .................. | 438/305 |
| 6,967,379 B2 | 11/2005 | Matsuo | |
| 6,977,415 B2 | 12/2005 | Matsuo | |
| 7,339,215 B2 * | 3/2008 | Chidambaram .............. | 257/288 |
| 7,378,305 B2 * | 5/2008 | Hatada et al. .................. | 438/153 |
| 7,504,301 B2 * | 3/2009 | Waite et al. .................... | 438/255 |
| 7,847,321 B2 * | 12/2010 | Hara .............................. | 257/213 |
| 2004/0155256 A1 * | 8/2004 | Tezuka et al. .................. | 257/103 |
| 2005/0082616 A1 * | 4/2005 | Chen et al. .................... | 257/350 |
| 2007/0096149 A1 * | 5/2007 | Liu et al. ....................... | 257/192 |

FOREIGN PATENT DOCUMENTS

JP    3651802    3/2005

OTHER PUBLICATIONS

Wang, J. et al., "Novel Channel-Stress Enhancement Technology with eSiGe S/D and Recessed Channel on Damascene Gate Process," 2007 Symposium on VLSI Technology Digest of Technical Papers, pp. 46-47, (2007).

Ohta et al., "High Performance 30 nm Gate Bulk CMOS for 45 nm Node with Σ-shaped SiGe-SD," IEEE (2005).

* cited by examiner

*Primary Examiner* — Kevin M Picardat
*Assistant Examiner* — Bac Au
(74) *Attorney, Agent, or Firm* — Finnegan, Henderson, Farabow, Garrett & Dunner, L.L.P.

(57) ABSTRACT

A semiconductor device according to an embodiment of the present invention includes a substrate, a gate insulation film formed on the substrate, a gate electrode formed on the gate insulation film, sidewall insulation films provided on side surfaces of the gate electrode, and stress application layers embedded in source and drain regions located, on a surface of the substrate, at a position which sandwiches the gate electrode, and applying stress to a channel region located under the gate insulation film in the substrate, a height of upper ends of interfaces between the substrate and the stress application layers being higher than a height of a lower end of an interface between the substrate and the gate insulation film.

9 Claims, 9 Drawing Sheets

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2007-328907, filed on Dec. 20, 2007, the entire contents of which are incorporated herein by reference.

BACKGROUND OF THE INVENTION

1. Field of the Invention

The present invention relates to a semiconductor device and a method of manufacturing the same.

2. Background Art

In recent years, attention has been drawn to a stress application technology called eSiGe (embedded SiGe) technology. In accordance with the eSiGe technology, peripheral regions of a pMOSFET are recessed to embed SiGe films in the regions by selective epitaxial growth to thereby apply stress to a channel region of the pMOSFET. This causes strain within the channel region of the pMOSFET so that the mobility in the channel region of the pMOSFET is improved. As a similar technology, there also exists a technology to recess peripheral regions of an nMOSFET to embed SiC films in the regions by selective epitaxial growth to thereby apply stress to a channel region of the nMOSFET. This causes strain within the channel region of the nMOSFET so that the mobility in the channel region of the nMOSFET is improved. However, in these stress application technologies, there are problems as described below.

As an embedding technology of the SiGe films, a technology called Σ-shape technology is known (see: IDEM2005, "High Performance 30 nm Gate Bulk CMOS for 45 nm Node with Σ-shaped SiGe-SD", H. Ohta et al.). In accordance with the Σ-shape technology, the peripheral regions are recessed by isotropic etching to thereby protrude the embedded regions of the SiGe films in a direction of the channel region. Thereby, the width of a substrate under the pMOS is narrowed, so that the stress applied to the channel region is increased. In the Σ-shape technology, by increasing an amount of protrusion of the embedded regions of the SiGe films, it is possible to increase the stress. However, in the case where the stress is increased by such a method, the fact that the width of the substrate under the PMOS is required to be larger than zero results in the upper limit of the amount of protrusion, and results in the upper limit of the stress. In other words, employment of such a method of increasing the stress leads to limit. On the other hand, the stress can be increased also by increasing Ge concentration. However, there is a possibility that the increased Ge concentration may induce crystal defects, and may be a cause to lower the yield of an integrated circuit. Accordingly, it is desirable to avoid using a method of increasing Ge concentration as far as possible. It is to be noted that the Σ-shape technology can be applied also to embedding of the SiC films.

In Japanese Patent No. 3651802, there is disclosed a method of processing the surface of a channel region by oxidizing it using plasma oxygen. In addition, a stress application technology using such a method is disclosed in '2007 Symposium on VLSI Technology Digest of Technical Papers, p. 46-47 "Novel Channel-Stress Enhancement Technology with eSiGe S/D and Recessed Channel on Damascene Gate Process", J. Wang et al.'

SUMMARY OF THE INVENTION

An aspect of the present invention is, for example, a semiconductor device including a substrate, a gate insulation film formed on the substrate, a gate electrode formed on the gate insulation film, sidewall insulation films provided on side surfaces of the gate electrode, and stress application layers embedded in source and drain regions located, on a surface of the substrate, at a position which sandwiches the gate electrode, and applying stress to a channel region located under the gate insulation film in the substrate, a height of upper ends of interfaces between the substrate and the stress application layers being higher than a height of a lower end of an interface between the substrate and the gate insulation film.

Another aspect of the present invention is, for example, a method of manufacturing a semiconductor device, the method including forming a dummy gate insulation film on a substrate, forming a dummy gate electrode on the dummy gate insulation film, forming first sidewall insulation films on side surfaces of the dummy gate electrode, recessing the substrate by anisotropic etching, using the first sidewall insulation films as masks, forming second sidewall insulation films on side surfaces of the first sidewall insulation films, after performing the anisotropic etching, further recessing the substrate by isotropic etching, using the second sidewall insulation films as masks, removing the second sidewall insulation films, after performing the isotropic etching, embedding stress application layers for applying stress to a channel region located under the dummy gate insulation film in the substrate, in trenches formed by the anisotropic and isotropic etchings, removing the dummy gate electrode and the dummy gate insulation film to expose a surface of the substrate, recessing the surface of the substrate to form a recessed part on the surface of the substrate, forming a gate insulation film on the recessed part of the substrate, and forming a gate electrode on the gate insulation film.

Another aspect of the present invention is, for example, a method of manufacturing a semiconductor device, the method including forming a dummy gate insulation film on a substrate, forming a dummy gate electrode on the dummy gate insulation film, forming sidewall insulation films on side surfaces of the dummy gate electrode, recessing the substrate by isotropic etching, using the sidewall insulation films as masks, embedding stress application layers for applying stress to a channel region located under the dummy gate insulation film in the substrate, in trenches formed by the isotropic etching, removing the dummy gate electrode and the dummy gate insulation film to expose a surface of the substrate, recessing the surface of the substrate to form a recessed part on the surface of the substrate, forming a gate insulation film on the recessed part of the substrate, and forming a gate electrode on the gate insulation film.

DESCRIPTION OF THE EMBODIMENTS

Embodiments of the present invention will be described with reference to the attached drawings.

(First Embodiment)

Figure 1:
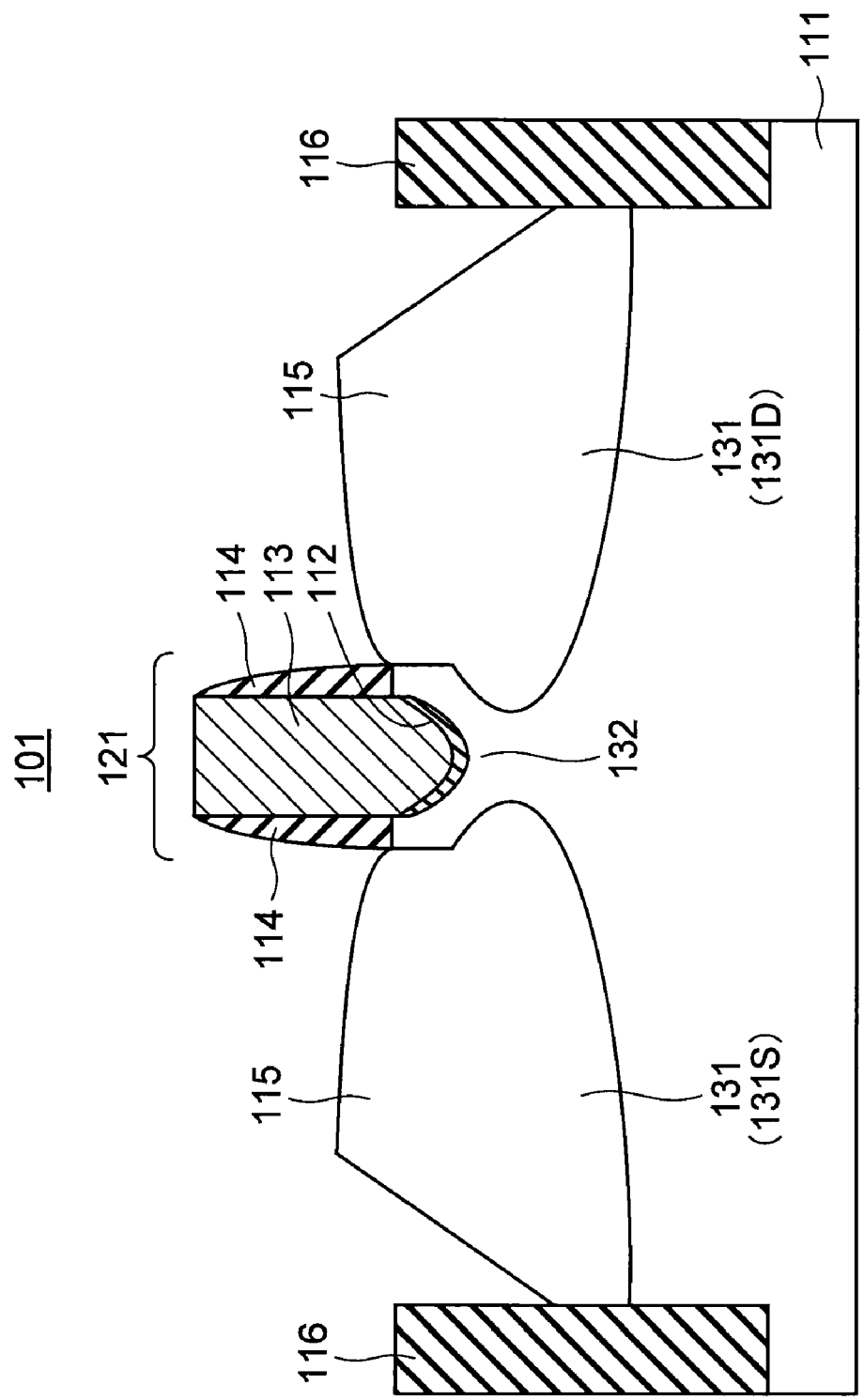
FIG. 1 is a side sectional view of a semiconductor device according to a first embodiment.

FIG. 1 is a side sectional view of a semiconductor device 101 according to a first embodiment. The semiconductor device 101 of FIG. 1 includes a substrate 111, a gate insulation film 112, a gate electrode 113, sidewall insulation films 114, stress application layers 115, and STI (Shallow Trench Isolation) layers 116. FIG. 1 further shows a MOSFET 121. The MOSFET 121 may be a pMOSFET or an nMOSFET. FIG. 1 further shows source and drain regions 131 serving as source and drain sections of the MOSFET 121, and a channel region 132 serving as a channel section of the MOSFET 121. The source and drain regions 131 are located, on the surface of the substrate 111, at a position which sandwiches the gate electrode 113. The channel region 132 is located under the gate insulation film 112 in the substrate 111.

The substrate 111 in this embodiment is a semiconductor substrate, more specifically, a silicon substrate. The substrate 111 may be a semiconductor substrate or an SOI (Semiconductor On Insulator) substrate. The gate insulation film 112 is formed on the substrate 111. The gate insulation film 112 in this embodiment is a silicon oxide film. The gate electrode 113 is formed on the gate insulation film 112. The gate electrode 113 in this embodiment is a polysilicon electrode.

The sidewall insulation films 114 are provided on side surfaces of the gate electrode 113. The sidewall insulation films 114 in this embodiment are silicon nitride films. Each of the sidewall insulation films 114 may be a single layer film including an insulation film or a multi-layer film including two or more insulation films. The stress application layers 115 are embedded in the source and drain regions 131 of the substrate 111, and apply stress to the channel region 132 of the substrate 111. The stress application layers 115 in this embodiment are SiGe (silicon germanium) layers. The stress application layers 115 may be SiC (silicon carbide) layers. In the case where the MOSFET 121 is pMOSFET, SiGe layers can be employed as the stress application layers 115. In the case where the MOSFET 121 is nMOSFET, SiC layers can be employed as the stress application layers 115. The STI layers 116 are embedded in the substrate 111. The STI layers 116 in this embodiment are silicon oxide films.

Figure 2:
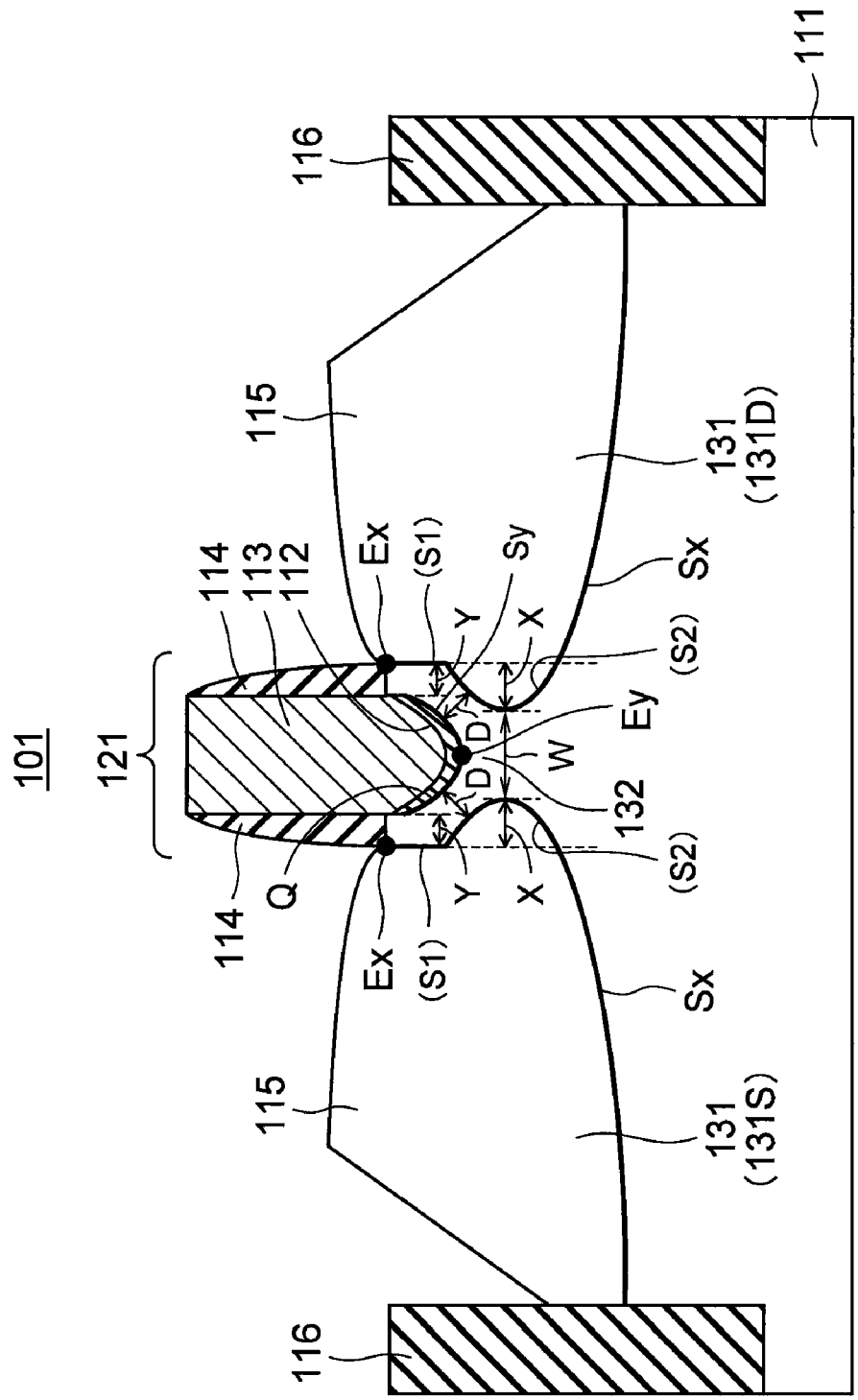
FIG. 2 is a side sectional view for explaining the structure of the semiconductor device of the first embodiment.

FIG. 2 is a side sectional view for explaining the structure of the semiconductor device 101 of FIG. 1.

In FIG. 2, interfaces between the substrate 111 and the stress application layers 115 are indicated by Sx, and an interface between the substrate 111 and the gate insulation film 112 is indicated by Sy. Furthermore, in FIG. 2, upper ends of the interfaces Sx are indicated by Ex, and a lower end of the interface Sy is indicated by Ey. The interface Sy in the vicinity of the lower end Ey is the channel surface of the MOSFET 121.

In this embodiment, as an embedding technology for the stress application layers 115, a technology called Σ-shape technology is adopted. Accordingly, in this embodiment, both the interface Sx in the source region (131S) side and the interface Sx in the drain region (131D) side are protruded in a direction of the channel region 132. For this reason, in this embodiment, the width W of the substrate 111 under the MOSFET 121 is caused to be narrow, so that a large stress is applied to the channel region 132. In this embodiment, by increasing the amount of protrusion of the interface Sx (indicated by X), it is possible to narrow the width W of the substrate 111.

Figure 3:
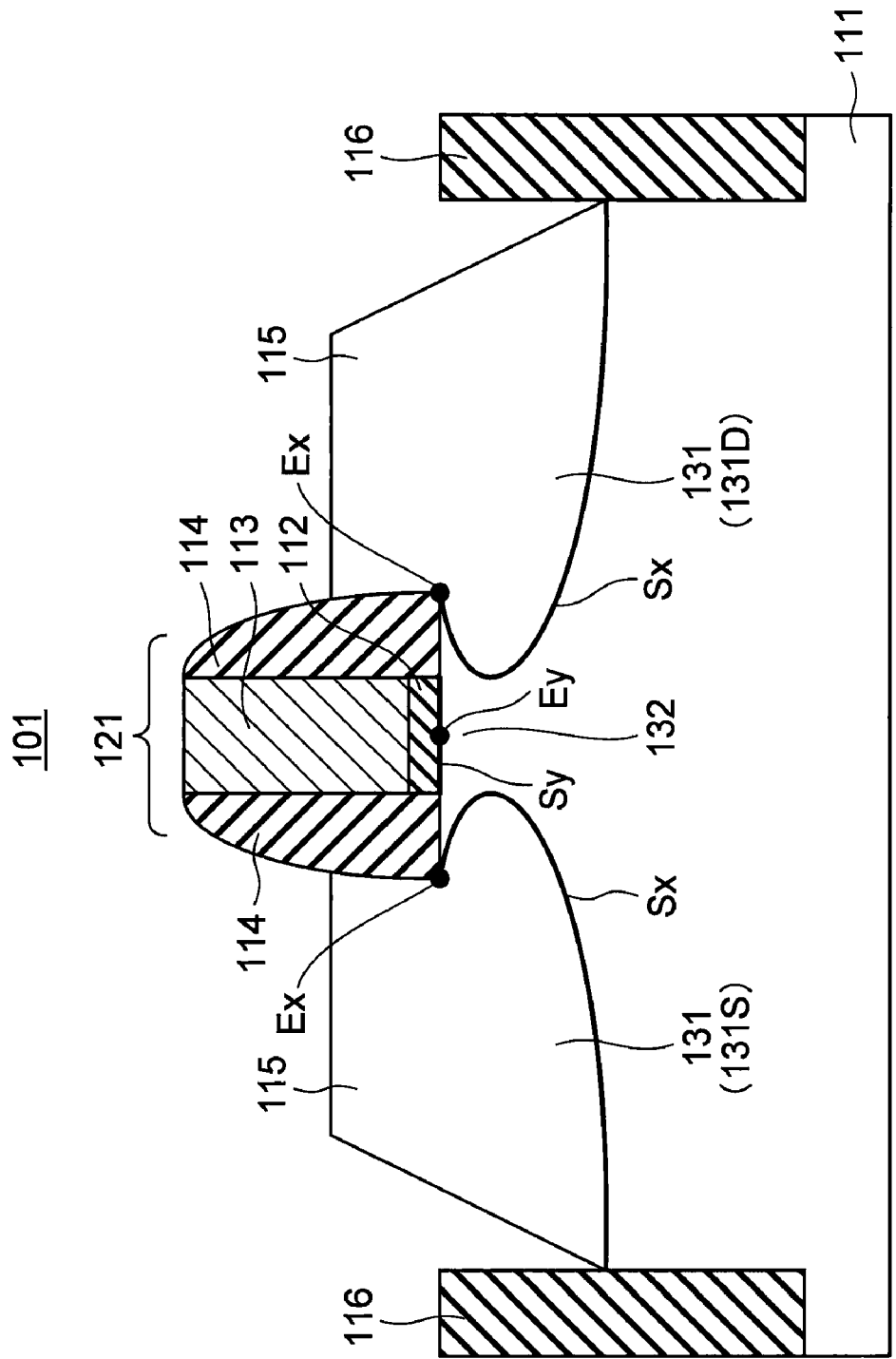
FIG. 3 is a side sectional view for explaining the structure of a semiconductor device of a comparative example.

In this embodiment, there is further formed a recessed part Q on the surface of the substrate 111, and the gate insulation film 112 is formed on the recessed part Q of the substrate 111. For this reason, in this embodiment, the height of the upper ends Ex of the interfaces Sx is higher than the height of the lower end Ey of the interface Sy. In other words, in this embodiment, the height of the upper ends Ex of the interfaces Sx is higher than that of the channel surface of the MOSFET 121. On the other hand, in a comparative example of FIG. 3, such a recessed part is not formed on the surface of the substrate 111. For this reason, in the comparative example, the height of the upper ends Ex of the interfaces Sx is the same as the height of the lower end Ey of the interface Sy. In other words, in the comparative example, the height of the upper ends Ex of the interfaces Sx is the same as that of the channel surface of the MOSFET 121.

Figure 4:
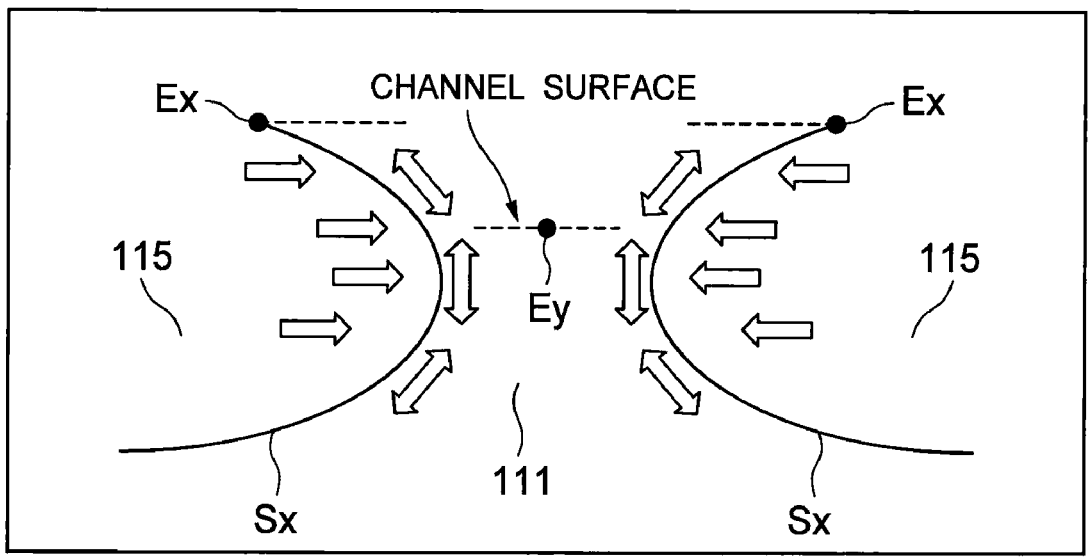
FIG. 4 is a diagram for explaining stress applied to a channel region of the first embodiment.
Figure 5:
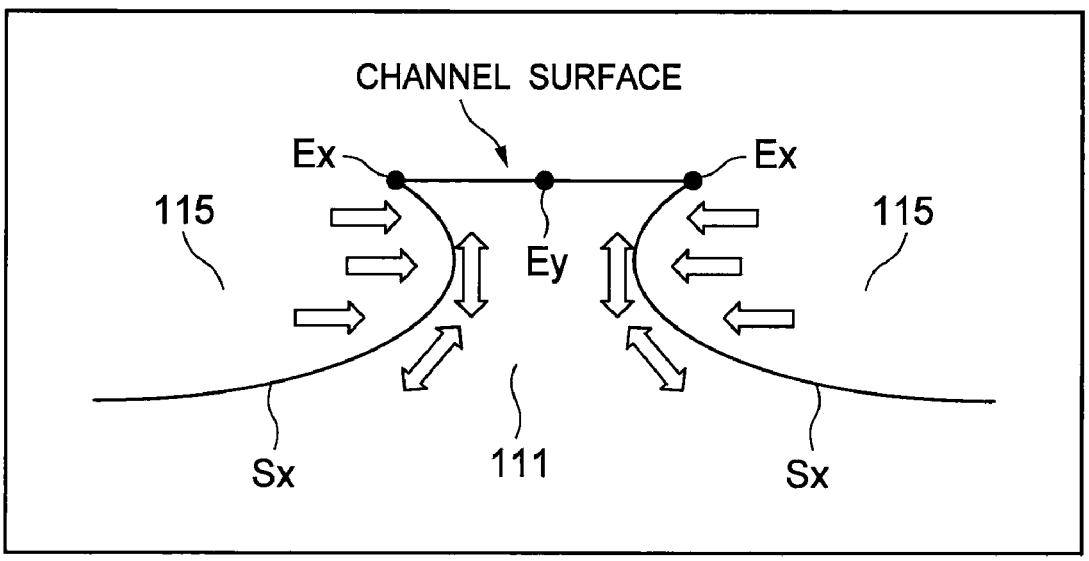
FIG. 5 is a diagram for explaining stress applied to a channel region of the comparative example.

Comparison between this embodiment and the comparative example will be made. FIG. 4 is a diagram for explaining stress applied to the channel region 132 of this embodiment. FIG. 5 is a diagram for explaining stress applied to the channel region 132 of the comparative example. In the comparative example, as shown in FIG. 5, the stress to the channel surface is applied only from positions lower than the channel surface. This is because the interfaces between substrate 111 and stress application layers 115 do not exist at positions higher than the channel surface. On the contrary, in this embodiment, as shown in FIG. 4, the stress to the channel surface is applied also from positions higher than the channel surface. This is because the interfaces between substrate 111 and stress application layers 115 exist also at positions higher than the channel surface. In this embodiment, the stress to the channel region 132 can be increased by making use of this.

As described above, in this embodiment, the height of the upper ends Ex of the interfaces Sx is caused to be higher than the height of the lower end Ey of the interface Sy, thereby making it possible to increase the stress to the channel region 132. Accordingly, in this embodiment, the stress to the channel region 132 can be increased without excessively narrowing the width W of the substrate 111 and excessively increasing Ge concentration in the stress application layers 115. For this reason, in this embodiment, the problem of the upper limit of the amount of protrusion X, and/or the problem of lowering of the yield of the semiconductor device 101 due to the increased Ge concentration can be avoided. Further, in this embodiment, the structure in which the height of the upper ends Ex of the interfaces Sx is higher than the height of the lower end Ey of the interface Sy is realized by forming the gate insulation film 112 on the recessed part Q of the substrate 111. While the bottom surface of the recessed part Q has a curved shape in this embodiment, the bottom surface may have a flat shape. An example of a method of forming the recessed part on the surface of the substrate is described in Japanese Patent No. 3651802. In this embodiment, by increasing the stress to the channel region 132, it is possible to increase drive force of the MOSFET 121.

The shape of each interface Sx in this embodiment will be described. As shown in FIG. 2, each interface Sx in this embodiment is substantially perpendicular to the principal surface of the substrate 111 in a region in the vicinity of the upper end Ex, and takes a convex shape in a direction of the channel region 132 in a region under the upper end Ex. In FIG. 2, the region in the vicinity of the upper end Ex is indicated by S1, and the region under the upper end Ex is indicated by S2.

In this embodiment, the thickness Y of the substrate 111 in the vicinity of the upper end Ex is ensured by such an interface structure. Accordingly, the distance between each interface Sx and the interface Sy, which is indicated by D, is ensured. As a result, the stress is effectively applied to the channel surface from positions higher than the channel surface.

As shown in FIG. 2, the interfaces Sx in the source region (131S) side and the drain region (131D) side have summit points of the protrusions, and the width W of the substrate 111 is narrowest at a position between these summit points. It is desirable that the channel surface is located in the vicinity of this position as close as possible. This is because large stress is applied to the position. It is possible to allow the channel surface to be close to the position, by deepening the depth of the recessed part Q. However, when the depth of the recessed part Q is deepened, the distance D is shortened, so that the stress applied to the position is reduced. However, in this embodiment, by sufficiently ensuring the thickness Y, it is possible to sufficiently ensure the distance D while increasing the depth of the recessed part Q. It is to be noted that, in this embodiment, the fact that the channel surface is caused to be close to the position corresponds to the fact that the lower end Ly of the interface Sy is caused to be close to the position. Accordingly, it is desirable that the lower end Ly of the interface Sy is located in the vicinity of the position. In other words, it is desirable that the height of the lower end Ly of the interface Sy is substantially the same as that of the summit points of the interfaces Sx.

FIGS. 6A to 6J show a manufacturing method of the semiconductor device 101 of FIG. 1.

Figure 6A:
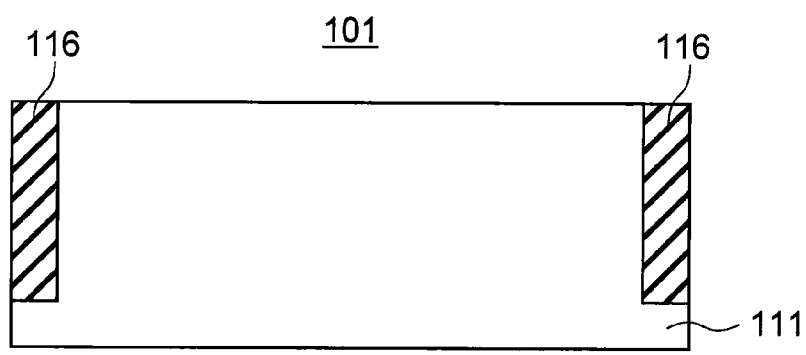
FIGS. 6A to 6J shows a manufacturing method of the semiconductor device according to the first embodiment.

First, as shown in FIG. 6A, STI layers 116 are formed on a substrate 111. The substrate 111 in this embodiment is a silicon substrate. The STI layers 116 in this embodiment are silicon oxide films. The STI layers 116 can be formed by forming trenches on the substrate 111 and embedding the STI layers 116 in the trenches.

Figure 6B:
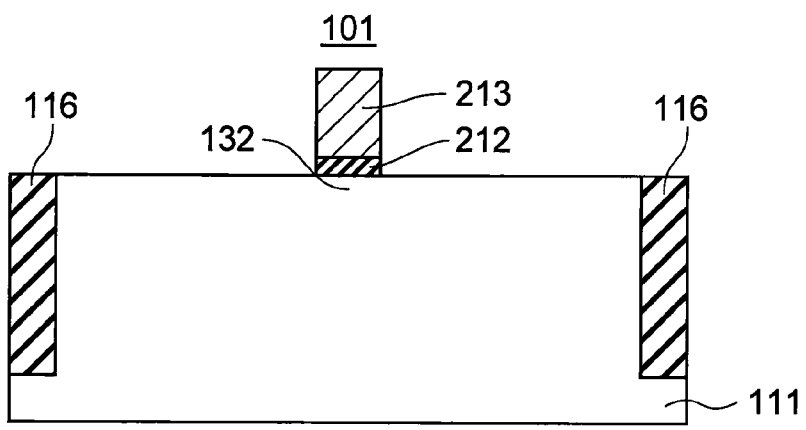

Next, as shown in FIG. 6B, a dummy gate insulation film 212 is formed on the substrate 111, and a dummy gate electrode 213 is formed on the dummy gate insulation film 212. The dummy gate insulation film 212 in this embodiment is a silicon oxide film. The dummy gate electrode 213 in this embodiment is a polysilicon electrode. The dummy gate insulation film 212 and the dummy gate electrode 213 can be formed by forming the dummy gate insulation film 212 on the substrate 111, forming a dummy gate electrode layer 213 on the dummy gate insulation film 212, and processing the dummy gate electrode layer 213 by etching. The dummy gate insulation film 212 and the dummy gate electrode 213 are formed on a channel region 132 of the substrate 111.

Figure 6C:
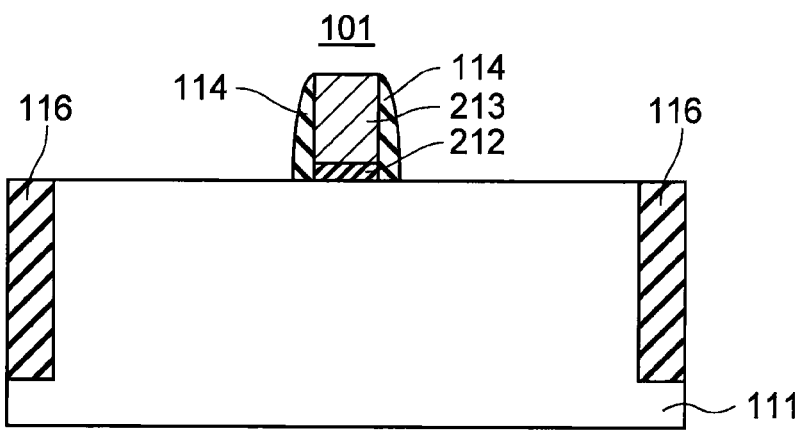

Next, as shown in FIG. 6C, sidewall insulation films 114, which are examples of first sidewall insulation films of the present invention, are formed on side surfaces of the dummy gate electrode 213. The sidewall insulation films 114 can be formed by depositing material of the sidewall insulation films 114 and etching back the material. The sidewall insulation films 114 in this embodiment are silicon nitride (SiN) films.

Figure 6D:
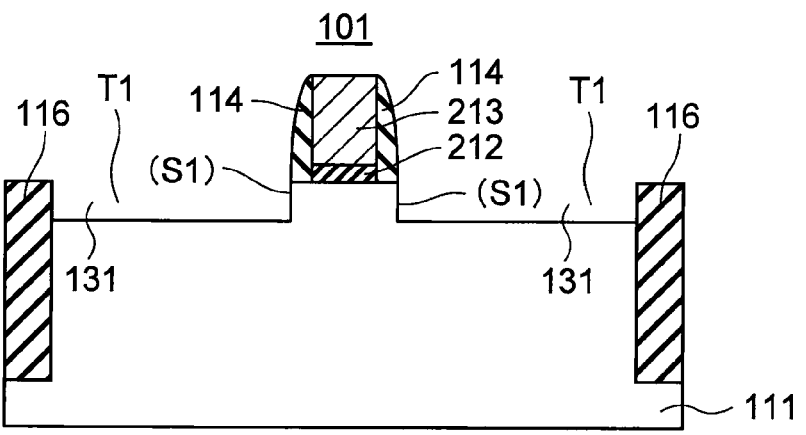

Next, as shown in FIG. 6D, the substrate 111 is recessed by anisotropic etching, using the sidewall insulation films 114 as masks. In this way, in the process of FIG. 6D, the substrate 111 is dug by etching having strong anisotropic property. Thereby, trenches T1 are formed in regions which are to be source and drain regions 131, and surfaces corresponding to S1 of FIG. 2 are formed.

Figure 6E:
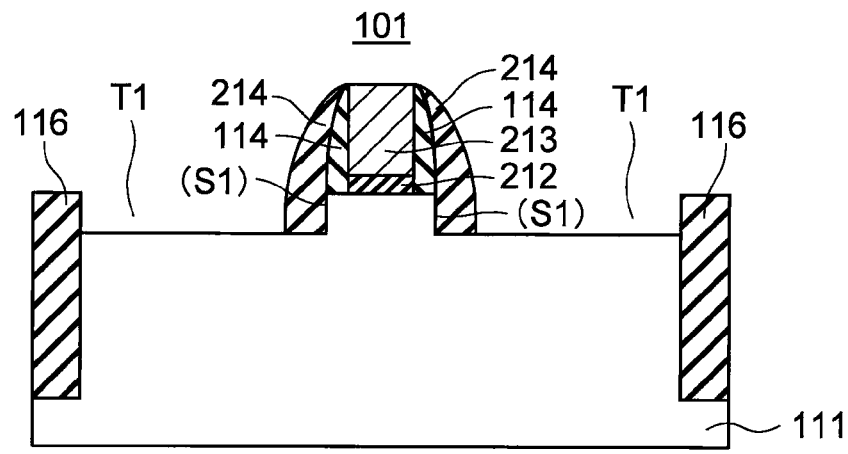

Next, as shown in FIG. 6E, after performing the anisotropic etching, sidewall insulation films 214, which are examples of second sidewall insulation films of the present invention, are formed on side surfaces of the sidewall insulation films 114.

The sidewall insulation films 214 can be formed by depositing material of the sidewall insulation films 214 and etching back the material. The sidewall insulation films 214 in this embodiment are silicon oxide ($SiO_2$) films.

Figure 6F:
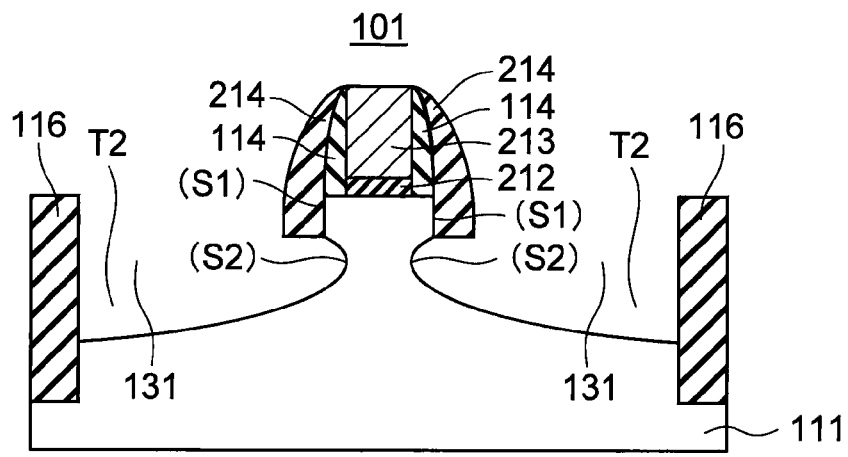

Next, as shown in FIG. 6F, the substrate 111 is further recessed by isotropic etching, using the sidewall insulation films 214 as masks. In this way, in the process of FIG. 6F, the substrate 111 is further dug by etching having strong isotropic property. Thereby, trenches T2 are formed in the regions which are to be the source and drain regions 131, and surfaces corresponding to S2 of FIG. 2 are formed.

Figure 6G:
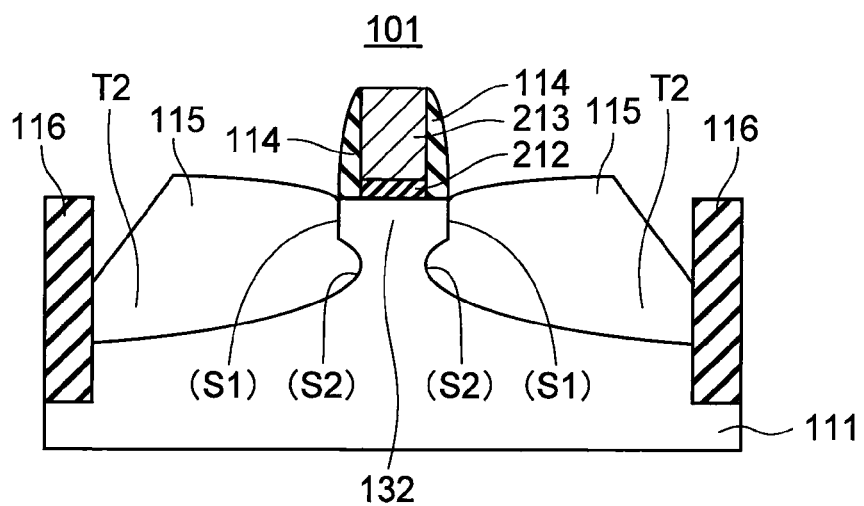

Next, as shown in FIG. 6G, after performing the isotropic etching, sidewall insulation films 214 are removed. Next, as shown in FIG. 6G, stress application layers 115 are embedded in the trenches T2 by selective epitaxial growth. The trenches T2 are formed by the anisotropic and isotropic etchings, and have the surfaces corresponding to S1 and S2 of FIG. 2. The stress application layers 115 in this embodiment are SiGe layers or SiC layers. Next, impurities are implanted into the stress application layers 115. In this way, the stress application layers 115 for applying stress to the channel region 132 located under the dummy gate insulation film 212 is formed.

Figure 6H:
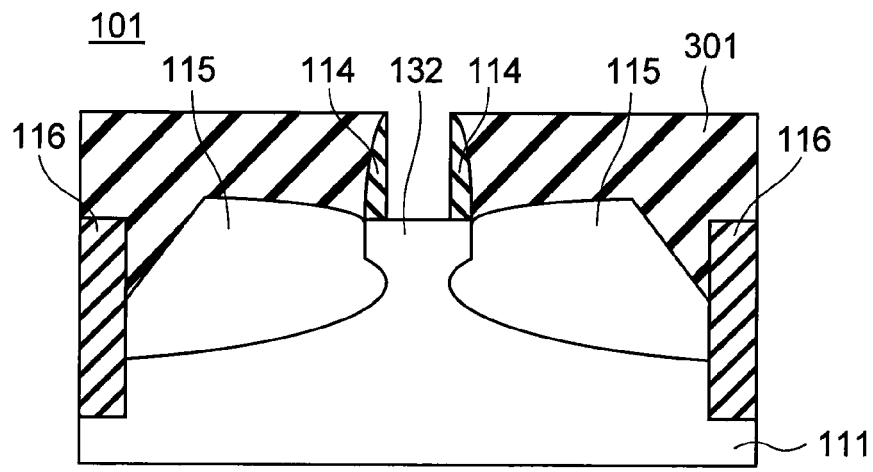
Figure 6:
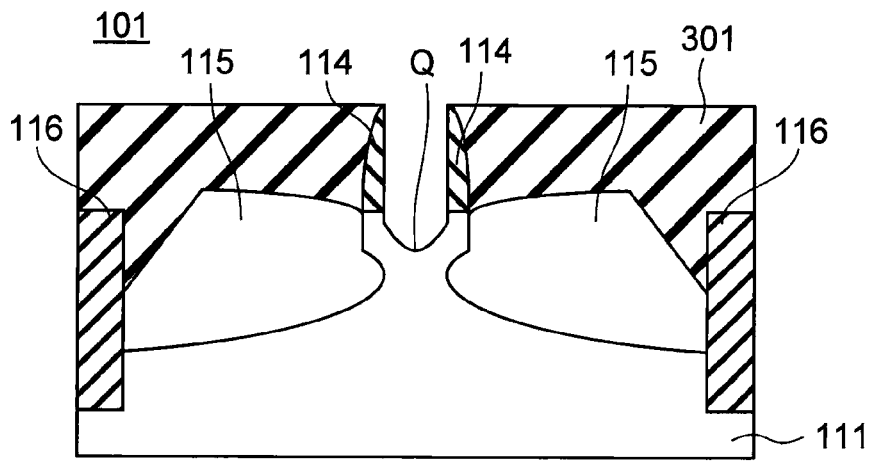

Next, as shown in FIG. 6H, an interlayer insulation film 301 is formed on the substrate 111. The interlayer insulation film 301 is, for example, a laminated film including a silicon nitride film and a silicon oxide film. The interlayer insulation film 301 can be formed, for example, by depositing the interlayer insulation film 301 on the substrate 111 by CVD and planarizing the interlayer insulation film 301 by CMP (Chemical Mechanical Polishing). Next, as shown in FIG. 6H, the dummy gate electrode 213 and the dummy gate insulation film 212 are removed to expose the surface of the substrate 111. The dummy gate electrode 213 can be selectively removed, for example, by etching using plasma. The dummy gate insulation film 212 can be selectively removed, for example, by using acid such as dilute hydrofluoric acid. By the process of FIG. 6H, the surface of the channel region 132 in the substrate 111 is exposed.

Next, as shown in FIG. 6I, the above described surface of the substrate 111 is recessed to form a recessed part Q on the surface of the substrate 111. In this way, a recessed channel is formed. The recessed part Q can be formed, for example, by oxidizing the surface of the substrate 111 by plasma oxygen and removing an oxide film formed on the surface of the substrate 111 by acid such as dilute hydrofluoric acid. In this embodiment, the oxidation temperature of the oxidation is 600 degrees of centigrade or less, preferably, 500 degrees of centigrade or less. Further, the depth of the recessed part Q is, for example, equal to or smaller than 6 nm. In this embodiment, the depth of the recessed part Q is about 6 nm.

Figure 6J:
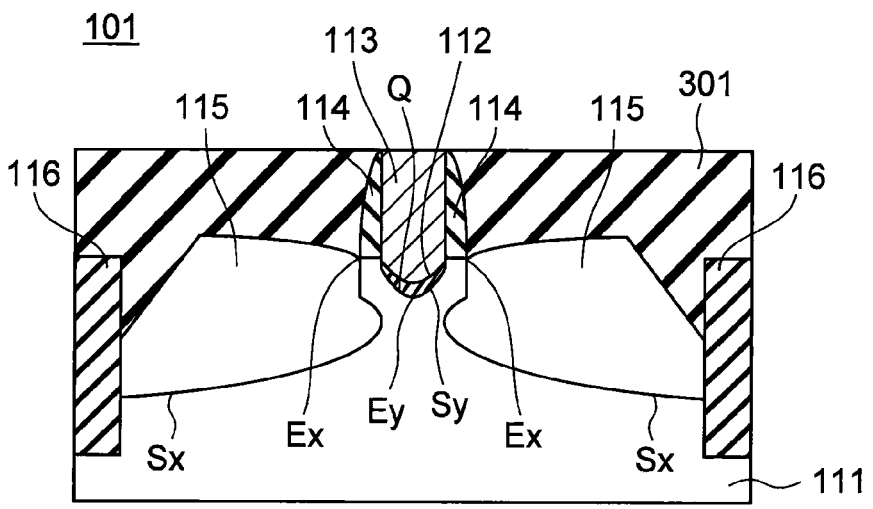

Next, as shown in FIG. 6J, a gate insulation film 112 is formed on the recessed part Q of the substrate 111, and a gate electrode 113 is formed on the gate insulation film 112. In this way, a damascene gate is formed. The gate insulation film 112 in this embodiment is a silicon oxide film. The gate electrode 113 in this embodiment is a polysilicon electrode. By the process of FIG. 6J, there is realized a structure in which the height of the upper ends Ex of the interfaces Sx is higher than the height of the lower end Ey of the interface Sy.

The etchings of the substrate 111 will be described. In FIGS. 6A to 6J, etching processes of the substrate 111 are performed twice. The first etching process is the anisotropic etching of FIG. 6D, and is performed for ensuring the thickness Y shown in FIG. 2. The second etching process is the isotropic etching of FIG. 6F, and is performed for adjusting the amount of protrusion X shown in FIG. 2. In the anisotropic etching process of FIG. 6D, the first sidewall insulation films 114 are used as masks. In the isotropic etching of FIG. 6F, the second sidewall insulation films 214 are used as masks. As shown in FIG. 6E, the second sidewall insulation films 214 are formed not only on the side surfaces of the first sidewall insulation films 114 but also on the side surfaces S1 of the substrate 111. Thereby, the side surfaces S1 of the substrate 111 are protected in performing the isotropic etching of FIG. 6F.

As described above, in this embodiment, the height of the upper parts of the interfaces between the substrate 111 and the stress application layers 115 is higher than the height of the lower end of the interface between the substrate 111 and the gate insulation film 112. Thereby, in this embodiment, stress to the channel region 132 can be increased.

A semiconductor device according to a second embodiment will be described. The second embodiment is a variation of the first embodiment, and will be described focusing on differences from the first embodiment.

(Second Embodiment)

Figure 7:
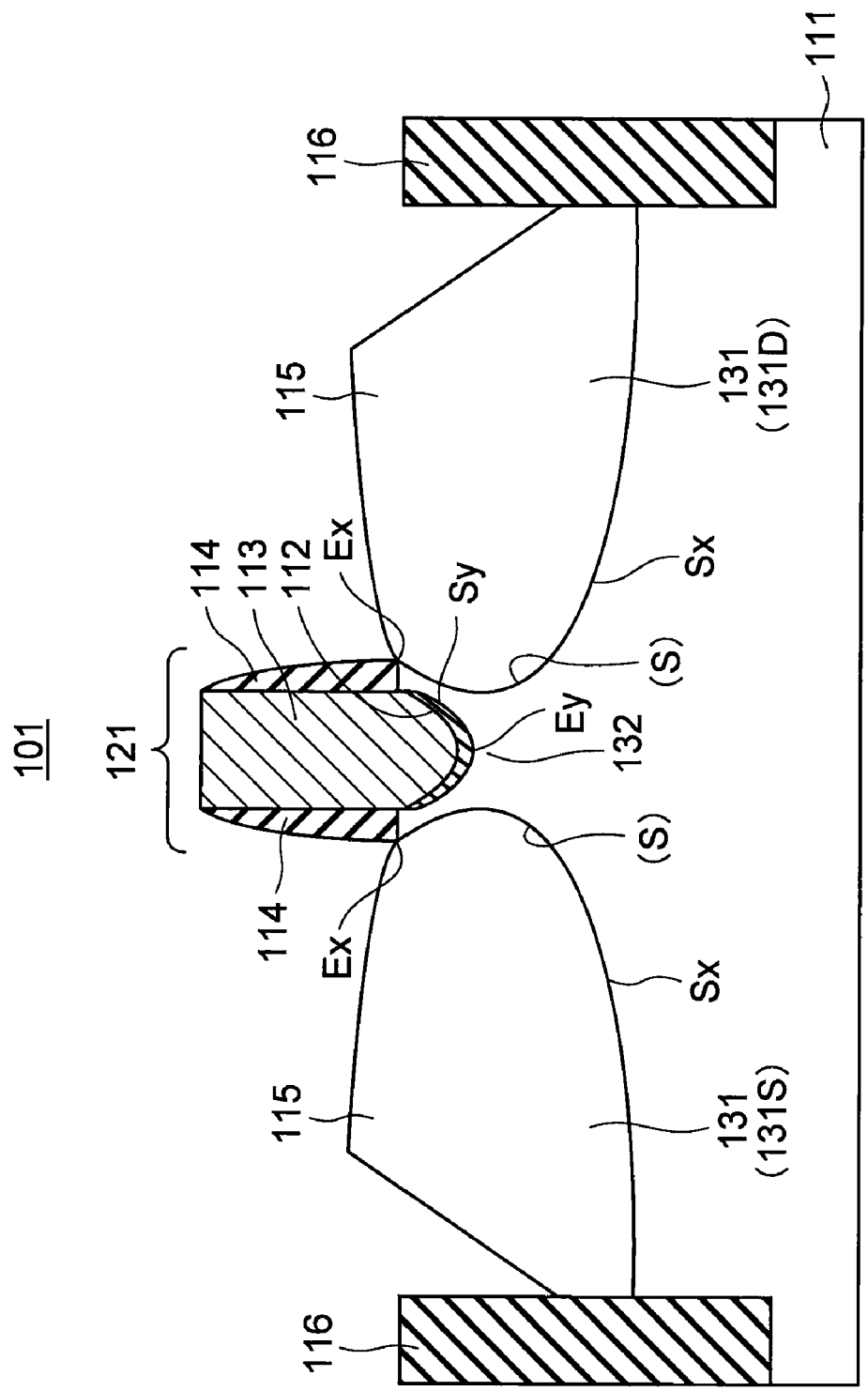
FIG. 7 is a side sectional view of a semiconductor device according to a second embodiment.

FIG. 7 is a side sectional view of a semiconductor device 101 according to a second embodiment. As shown in FIG. 7, each interface Sx of this embodiment takes a convex shape in a direction of the channel region 132, in a region ranging from a part in the vicinity of the upper end Ex to a part under the upper end Ex. In FIG. 7, the region is indicated by S. The semiconductor device 101 of this embodiment employs an interface structure of FIG. 7 instead of the interface structure of FIG. 2.

Figure 8:
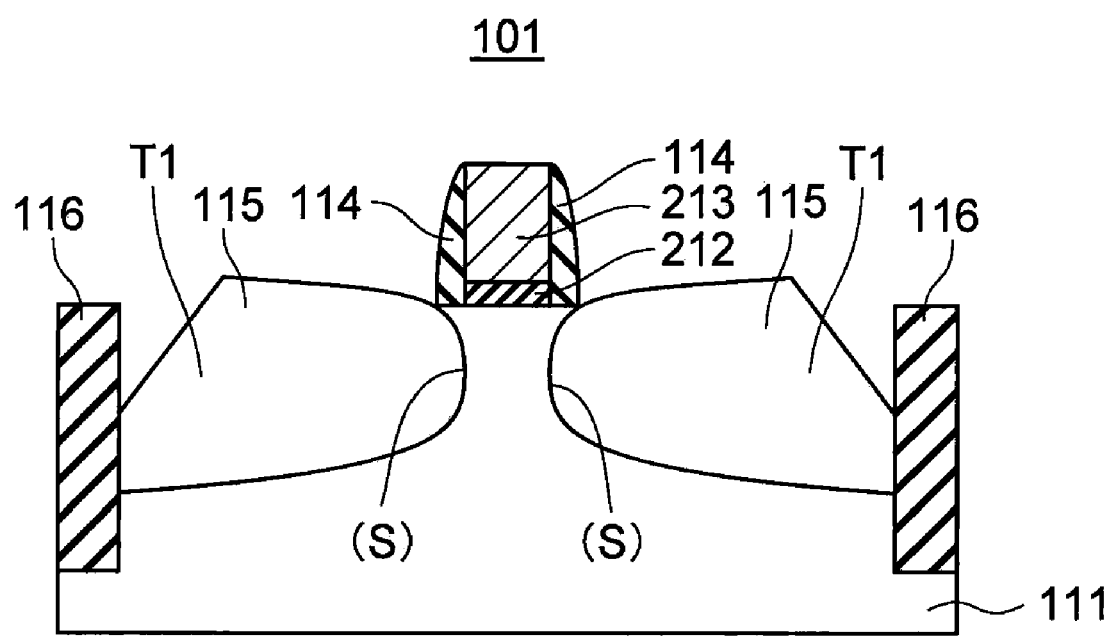
FIG. 8 shows a manufacturing method of the semiconductor device according to the second embodiment.

In the case where the semiconductor device 101 of FIG. 7 is manufactured by the manufacturing method of FIGS. 6A to 6J, isotropic etching is performed in the process of FIG. 6D instead of the anisotropic etching. In this case, the process for forming the second sidewall insulation films 214 in FIG. 6E, the process for performing the isotropic etching in FIG. 6F, and the process for removing the second sidewall insulation films 214 in FIG. 6G are unnecessary. In this case, the manufacturing process diagram of FIG. 6G is replaced by a manufacturing process diagram of FIG. 8.

It is to be noted that the interface structure of FIG. 2 has an advantage that the distance D is apt to be ensured, compared to the interface structure of FIG. 7. As described above, in accordance with the interface structure of FIG. 2, by sufficiently ensuring the thickness Y, it is possible to sufficiently ensure the distance D while deepening the depth of the recessed part Q. On the other hand, the interface structure of FIG. 7 has an advantage that etching process of the substrate 111 is required only once.

As described above, in accordance with embodiments of the present invention, there are provided a preferred structure and technique for applying stress to the channel region to cause strain in the channel region.

Although examples of specific aspects of the present invention are described above in the first and second embodiments, the present invention is not limited to these embodiments.

The invention claimed is:

1. A semiconductor device comprising:
a substrate;
a gate insulation film formed on the substrate;
a gate electrode formed on the gate insulation film;
sidewall insulation films provided on side surfaces of the gate electrode; and
stress application layers embedded in source and drain regions located, on a surface of the substrate, at a position which sandwiches the gate electrode, and applying stress to a channel region located under the gate insulation film in the substrate, a height of upper ends of interfaces between the substrate and the stress application layers being higher than a height of a lower end of an interface between the substrate and the gate insulation film.

2. The device according to claim 1, wherein,
each of the interfaces between the substrate and the stress application layers is substantially perpendicular to a principal surface of the substrate in a region in the vicinity of the upper end, and takes a convex shape in a direction of the channel region in a region under the upper end.

3. The device according to claim 2, wherein,
the height of the lower end is substantially the same as a height of a summit point of the convex shape.

4. The device according to claim 1, wherein,
each of the interfaces between the substrate and the stress application layers takes a convex shape in a direction of the channel region, in a region ranging from a part in the vicinity of the upper end to a part under the upper end.

5. The device according to claim 4, wherein,
the height of the lower end is substantially the same as a height of a summit point of the convex shape.

6. The device according to claim 1, wherein,
the gate insulation film is formed on a recessed part formed on the surface of the substrate.

7. The device according to claim 6, wherein,
a bottom surface of the recessed part takes a curved shape or a flat shape.

8. The device according to claim 6, wherein the depth of the recessed part is equal to or smaller than 6 nm.

9. The device according to claim 1, wherein
the stress application layers are SiGe (silicon germanium) layers or SiC (silicon carbide) layers.

* * * * *